United States Patent
Kato

(10) Patent No.: US 6,465,818 B1
(45) Date of Patent: Oct. 15, 2002

(54) SEMICONDUCTOR MEMORY DEVICE CAPABLE OF PERFORMING DATA WRITING OR ERASING OPERATION AND DATA READING OPERATION IN PARALLEL

(75) Inventor: Hideo Kato, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/478,057

(22) Filed: Jan. 5, 2000

(30) Foreign Application Priority Data

Jan. 11, 1999 (JP) .......................... 11-004742

(51) Int. Cl.$^7$ ................................. G11C 5/02
(52) U.S. Cl. .................... 257/207; 257/202; 365/51; 365/63
(58) Field of Search ................ 257/202–211; 365/189.04, 225.7, 51, 63, 207, 185.11, 230.03

(56) References Cited

U.S. PATENT DOCUMENTS 5,361,223 A * 11/1994 Inoue et al. .............. 365/51
5,867,430 A    2/1999 Chen et al.
5,930,195 A    7/1999 Komatsu

FOREIGN PATENT DOCUMENTS

| JP | 10-144086 | 5/1998 | |
| WO | WO9828750 A | * 7/1998 | ............ 365/189.09 |

* cited by examiner

*Primary Examiner*—Minh Loan Tran
*Assistant Examiner*—Thomas L Dickey
(74) *Attorney, Agent, or Firm*—Hogan & Hartson, LLP

(57) ABSTRACT

A memory cell array 1 is divided into two banks BANK 1 and BANK 2 for performing a dual operation. The division into banks is accomplished by dividing main bit lines MBL of the memory cell array 1 into upper and lower parts. On both end portions of the memory cell array 1 in the directions of the bit lines, sense amplifier circuits 2a and 2b connected to the divided parts of main bit lines MBL, respectively, are arranged. By changing the wiring design of the main bit lines MBL, the capacities of the banks BANK 1 and BANK 2 are changed.

16 Claims, 14 Drawing Sheets

| | Vg | Vd | Vs |
|---|---|---|---|
| WRITE | 10V | 6V | 0V |
| ERASE | −7V | OPEN | 6V |
| READ | 5V | 1V | 0V |

SEMICONDUCTOR MEMORY DEVICE CAPABLE OF PERFORMING DATA WRITING OR ERASING OPERATION AND DATA READING OPERATION IN PARALLEL

BACKGROUND OF THE INVENTION

1. Field of the Invention

The present invention relates generally to a semiconductor memory device wherein a memory cell array is divided into banks to write and read data in parallel.

2. Description of Related Background Art

Conventionally, there are various electronic systems comprising various built-in memory devices. For example, there is an electronic system wherein an EEPROM flash memory and an SRAM are built in, and data of the flash memory are stored in the SRAM to be exchanged between a CPU and the flash memory via the SRAM and to be directly rewritable without the need of the SRAM.

On the other hand, in recent years, there is known a memory system called a dual operation type (or a dual port type) memory system which is capable of reading data from a certain memory area while writing data in another memory area in order to reduce the number of memory chips necessary for the memory system. In order to construct a memory system of this type, two completely independent memory areas may be simply provided in a memory device.

However, if independently accessed memory areas are simply provided in the memory device, there are still many problems as a dual operation type memory system. First, since a decoder and a sense amplifier must be provided independently in each of the memory areas, the layout area of the memory system is large. Secondly, if bit lines and word lines are continuously provided independently in each of the memory areas, it is not possible to divide each of the memory areas into blocks to read and write data every block. That is, the memory areas for reading and writing data in parallel are fixed. However, in fact, with respect to the capacities of the memory areas capable of reading and writing data in parallel, there are various requests in accordance with the use of the memory device and so forth. In order to apply the memory device to various uses, various memory areas having different capacities must be prepared.

On the other hand, an EEPROM flash memory capable of optionally dividing a single memory cell array area into blocks to write and read data in parallel every block is proposed in, e.g., Japanese Patent Laid-Open No. 10-144086. In this memory, a memory cell array is divided into a plurality of blocks along a line perpendicular to word lines, and a separating transistor is inserted into each of the word lines between adjacent blocks, so that the size of memory areas for the dual operation can variably set by the ON-OFF control of the separating transistor.

However, in the above described dual operation type flash memory, there are still the following problems, since the memory cell array area is divided into blocks along the line perpendicular to the word lines. First, a high voltage boosted during a data writing operation is used for the word lines. Therefore, for example, when data are written by selectively driving the word lines of an intermediate block using a left row decoder, the word lines are common to an unselected block adjacent to the left side of a selected block, so that the unselected block is in a half-write state. Therefore, the deterioration of data in the unselected block increases, and erroneous write and so forth are easily caused. Secondly, row decoder circuits having the same structure must be provided on both sides of the memory cell array in the directions of the word lines, so that the layout area of the memory system is large.

SUMMARY OF THE INVENTION

It is therefore an object of the present invention to eliminate the aforementioned problems and to provide a semiconductor memory device of a dual operation type, which divides a memory cell array into banks by separating bit lines, and of a semi-custom system capable of easily changing of the capacities of the banks.

In order to accomplish the aforementioned and other objects, according to one aspect of the present invention, a semiconductor memory device comprising: a memory cell array having a plurality of memory cells, each of which is arranged at a corresponding one of intersections, at which bit lines intersect word lines, the memory cell array being divided into first and second banks along a line intersecting the bit lines, which are separated between the first and second banks; a first sense amplifier arranged on one side of the directions of the bit lines of the memory cell array, the first sense amplifier being connected to the bit lines of the first bank to sense signals of the bit lines of the first bank; a second sense amplifier arranged on the other side of the directions of the bit lines of the memory cell array, the second sense amplifier being connected to the bit lines of the second bank to sense signals of the bit lines of the second bank; a row decoder for selectively driving the word lines of the memory cell array; and a parallel control circuit for allowing one of the first and second banks to perform a data writing or erasing operation while allowing the other of the first and second banks to perform a data reading operation.

According to the present invention, the sense amplifier circuits are arranged on both end portions of the memory cell array, and the division of the memory cell array into banks is carried out by separating the bit lines along the line intersecting the bit lines. Even if the division of the memory cell array into banks along the line intersecting the bit lines is carried out, if the sense amplifier circuits of the divided banks are arranged between the banks, it is required to greatly change the chip layout in accordance with the change of the layout of the sense amplifier circuits in order to change the capacities of the banks. On the other hand, according to the present invention, since the sense amplifier circuit are arranged on both sides of the memory cell array, it is not required to change the layout of the memory cell array and the sense amplifier circuits when the capacities of the banks are changed, and it has only to change a process for patterning a wiring layer or the like constituting the bit lines. That is, if a master chip before a wiring process is prepared, various products having different capacity ratios of divided banks at a user's request can be simply produced by only the design change of wiring. Thus, the turn-around-time (TAT) of a dual operation type memory device can be shortened.

Furthermore, the architecture of the row decoder part for selectively driving the word lines must also be changed due to the division into banks using separating the bit lines. This can be simply changed by separating address signal lines at a place corresponding to the separated place of the bit lines, if the number of address signal lines arranged on one end side of the memory cell array in the directions of the word lines is previously prepared so as to be able to cope with the change of the division into banks. However, also in this case, as described above, the number of the address signal lines capable of covering the whole variable range of the capacities of the divided banks must be previously prepared, and a pre-decoder must be prepared so as to be able to simultaneously drive the divided address signal lines. However, even if these arrangements must be made, the increase of the layout area is smaller than that when row decoders having the same architecture are arranged on both sides of the word lines in order to divide the memory cell array into banks along the line perpendicular to the word lines.

Alternatively, according to the present invention, at least two separating transistors may be provided in the bit lines of the memory cell array, and a separation control circuit including a non-volatile memory, such as a fuse circuit, for controlling ON-OFF of the separating transistors may be provided, so that the division of the memory cell array into banks may be carried out by the programming of the separation control circuit. Also in this case, it is possible to simply divide the memory cell array into banks after a memory chip is completed, so that the TAT can be shortened.

The present invention can be applied various semiconductor memories, such as DRAMS and SRAMS, in addition to EEPROM flash memories. In particular, when the semiconductor memory comprises an electrically rewritable non-volatile memory cell, such as a flash memory, wherein a high voltage is used for a rewrite operation, it is possible to prevent a half-selected state, in which a high voltage is applied to the word lines of a bank in an unselected state, from occurring, so that it is possible to improve reliability, unlike a case where the division of the memory cell array into banks along the line perpendicular to the word lines is carried out.

DESCRIPTION OF THE PREFERRED EMBODIMENTS

First Preferred Embodiment

Figure 1:
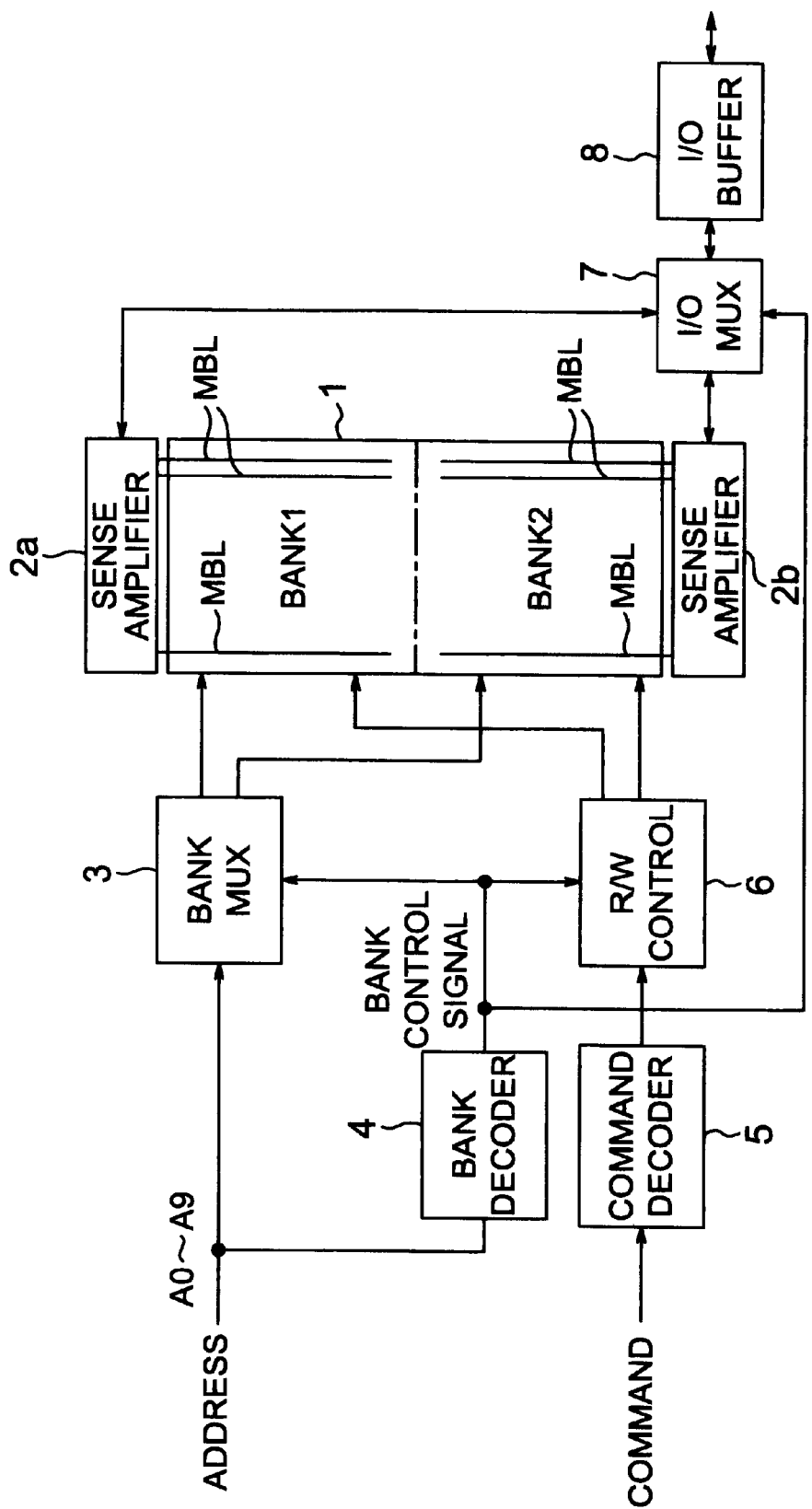
FIG. 1 is a block diagram of the first preferred embodiment of a flash memory according to the present invention.

FIG. 1 is a block diagram of the first preferred embodiment of an EEPROM flash memory according to the present invention. As shown in this figure, a memory cell array 1 is divided into two banks BANK 1 and BAND 2 by separating main bit lines MBL along a line intersecting the main bit lines MBL, specifically along a line substantially perpendicular to the main bit lines MBL. On both sides of the memory cell array 1 in the directions of the bit lines, sense amplifier circuits 2a and 2b are arranged so as to correspond to the banks BANK 1 and BANK 2, respectively. The sense amplifier circuits 2a and 2b are connected to the main bit lines MBL to sense signals of the main bit lines MBL. By thus providing the sense amplifier circuits 2a and 2b adjacent to the banks BANK 1 and BANK 2, since it is not necessary to extend the main bit lines MBL from the memory cell array 1 to sense amplifier circuits 2a and 2b, the wiring lengths of the main bit lines MBL can be shortened, and the capacities of the main bit lines MBL can be decreased. Therefore, the working speed of the flash memory can be increased.

The sense amplifier circuits 2a and 2b are designed to be selectively connected to an I/O buffer 8 via an I/O multiplexer 7 so that a data read operation is performed in one of the banks BANK 1 and BANK 2 while a data erasing/writing operation is performed in the other bank BANK 1 or BANK 2. In addition, a bank multiplexer 3 is provided to selectively access the banks BANK 1 and BAND 2 in accordance with an address. These multiplexers 3 and 7 are controlled by a bank control signal, which is produced by decoding suitable upper bits of an address, which is acquired by an address buffer (not shown), by means of a bank decoder 4.

In addition, commands for writing/erasing and reading data are decoded by a command decoder 5, the output of which is transmitted to a read/write control circuit 6. By this control circuit 6, a control for erasing/writing and reading data in and from each of banks BANK 1 and BANK 2 in parallel is performed.

Figure 2:
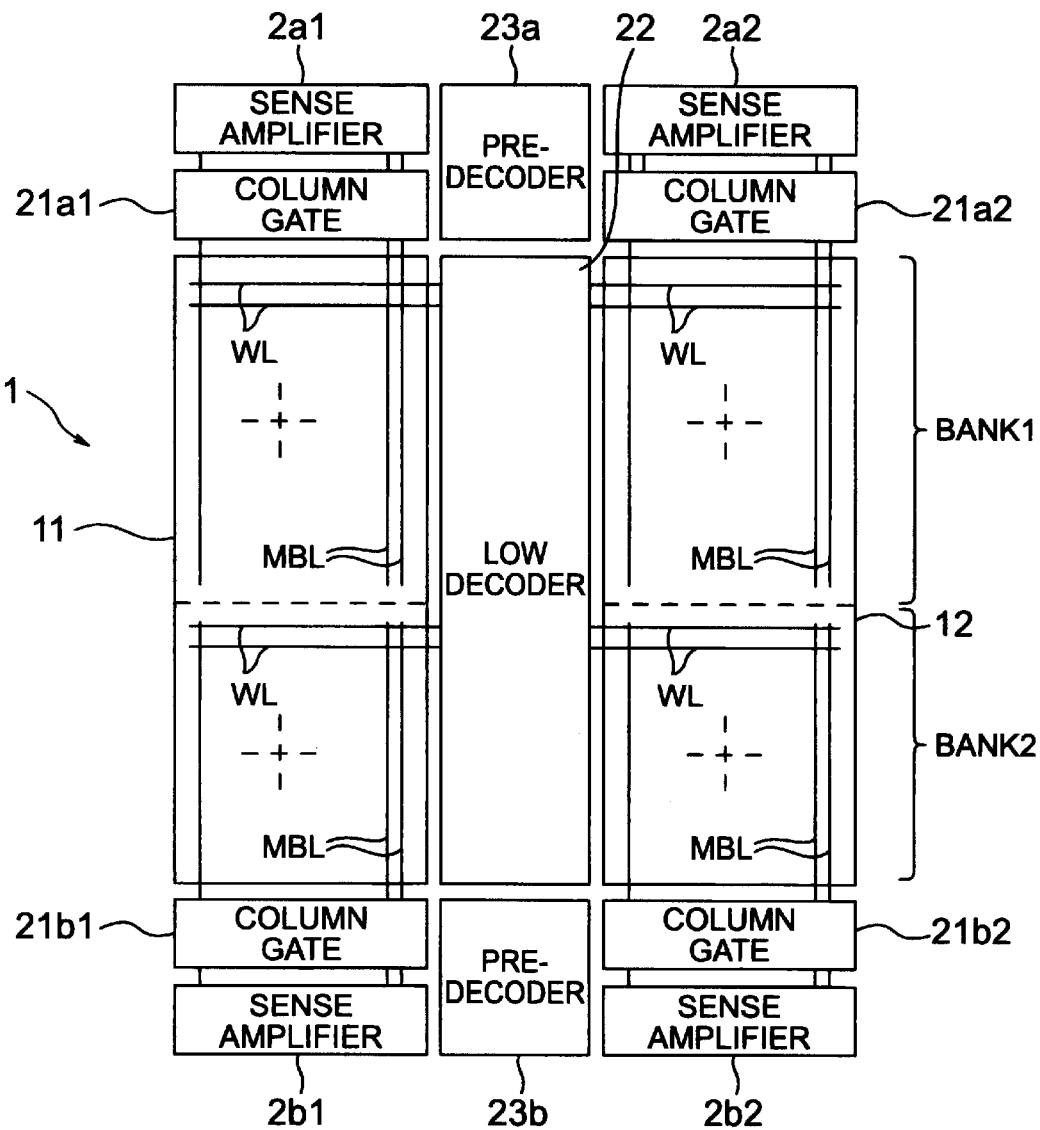
FIG. 2 is a diagram showing the details of a peripheral portion around a memory cell array in the first preferred embodiment.

Specifically, as shown in FIG. 2, the memory cell array 1 is divided into two cell arrays 11 and 12 arranged on both sides of a row decoder 22. In each of the cell arrays 11 and 12, word lines WL independently and selectively driven by the row decoder 22, and main bit lines MBL perpendicular to the word lines WL are provided. The main bit lines MBL are connected to sense amplifier circuits 2a (2a1, 2a2) and 2b (2b1, 2b2) via column gates 21a (21a1, 21a2) which are not shown in FIG. 1. As will be described in detail later, the row decoder circuit 22 has address signal lines 221 (see FIG. 5) which are separated at the same place as the separated place of the main bit lines MBL so as to correspond to the banks BANK 1 and BANK 2. In order to separately drive the divided address signal lines 221, pre-decoders 23a and 23b are arranged on both sides of the row decoder circuit 22.

Figure 3:
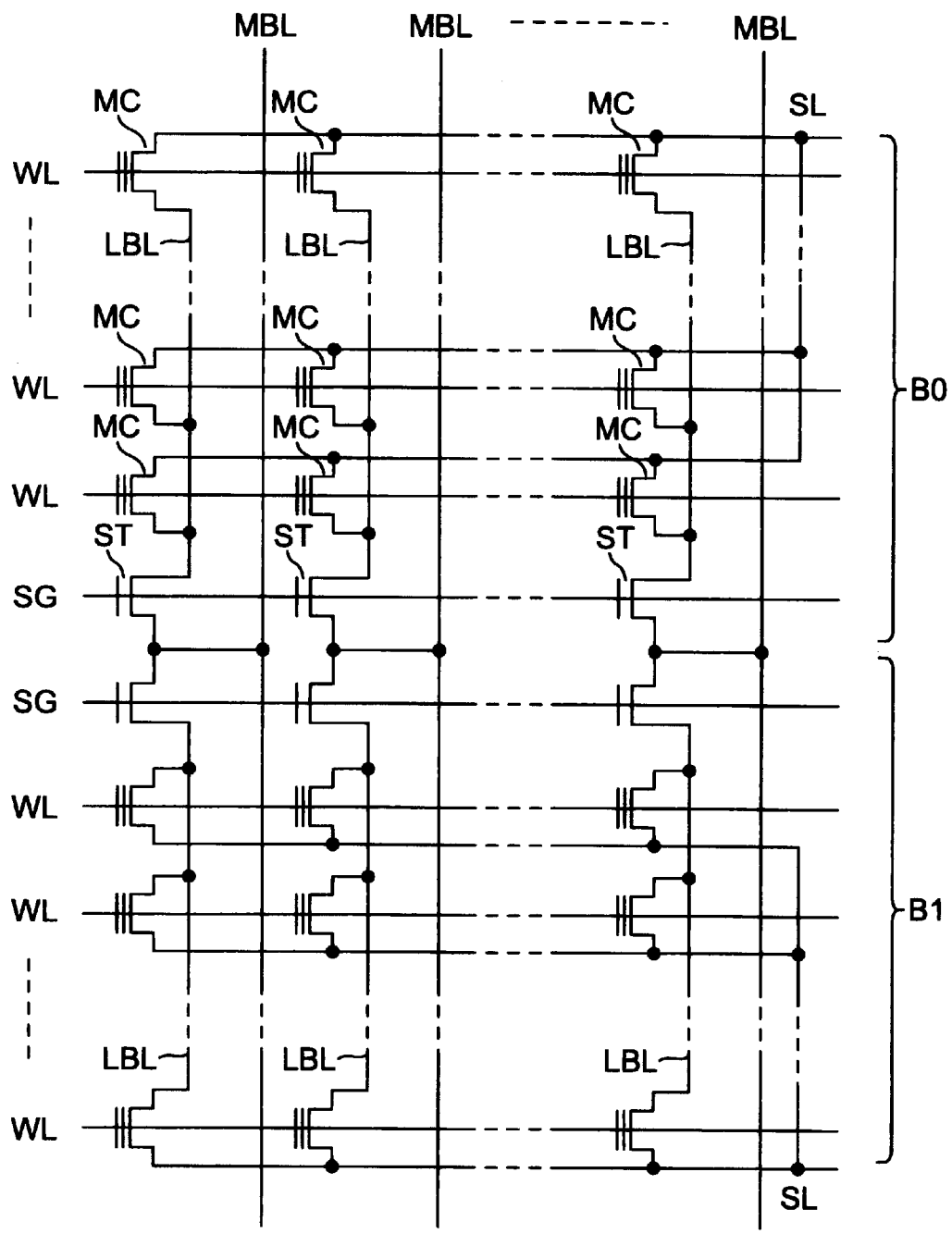
FIG. 3 is a diagram showing the details of the memory cell array in the first preferred embodiment.

FIG. 3 shows the details of the memory cell array 1. For example, each of memory cells MC has a MOS transistor structure wherein a floating gate and a control gate are stacked. A plurality of (e.g., 8) memory cells MC are connected to each of local bit lines LBL in parallel, and the gates of laterally arranged memory cells MC are connected commonly to one of the word lines WL. The local bit lines LBL are connected to the main bit lines MBL via select transistors ST, respectively. Thus, the memory cells MC are divided into a plurality of blocks B0, B1, . . . along the line substantially perpendicular to the bit lines. The sources of the memory cells MC are connected to a source line SL every block B0, B1, . . . , and each of the blocks B0, B1, . . . serves as a unit of a batch erase.

Figure 7:
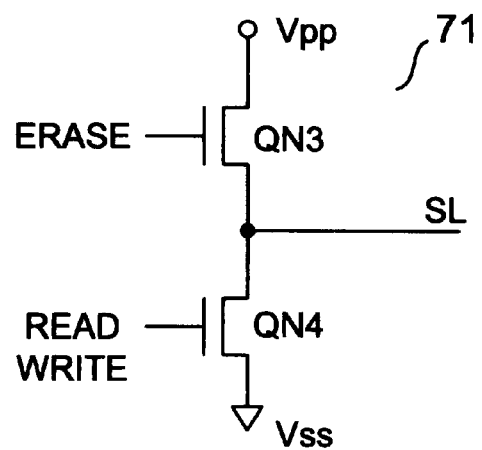
FIG. 7 is a circuit diagram of a source line control circuit in the first preferred embodiment.

As shown in FIG. 7, the common source line SL of each of the blocks is provided with a source line control circuit 71. During a data erasing operation, the NMOS transistor QN3 of the source line control circuit 71 is turned ON in response to an erase control signal ERASE to apply a boosted voltage Vpp to the source line SL. During a data reading or writing operation, the NMOS transistor QN4 is turned ON in response to a control signal READ or WRITE to set the source line SL at the ground potential.

The data writing and reading operations of the flash memory in this preferred embodiment will be described below. In a data writing mode, a boosted write voltage is applied to a selected word line WL, and a high or low voltage is applied to the local bit lines LBL in accordance with data. Thus, a channel current flows through a selected memory cell MC, and hot-electrons are injected into a floating gate to be in a high threshold stage. Usually, before this data writing mode, the batch erase of data is performed every block. During this batch erase, all of the word lines of the selected block are set to be at a low level (e.g., the ground level), and the boosted voltage Vpp is applied to the common source line SL of the memory cell. Thus, the electrons of the floating gate of the memory cell are emitted to the source. In the data reading mode, a read voltage is applied to a selected word line, and the ON-OFF of the memory cell is detected.

Figure 3A:
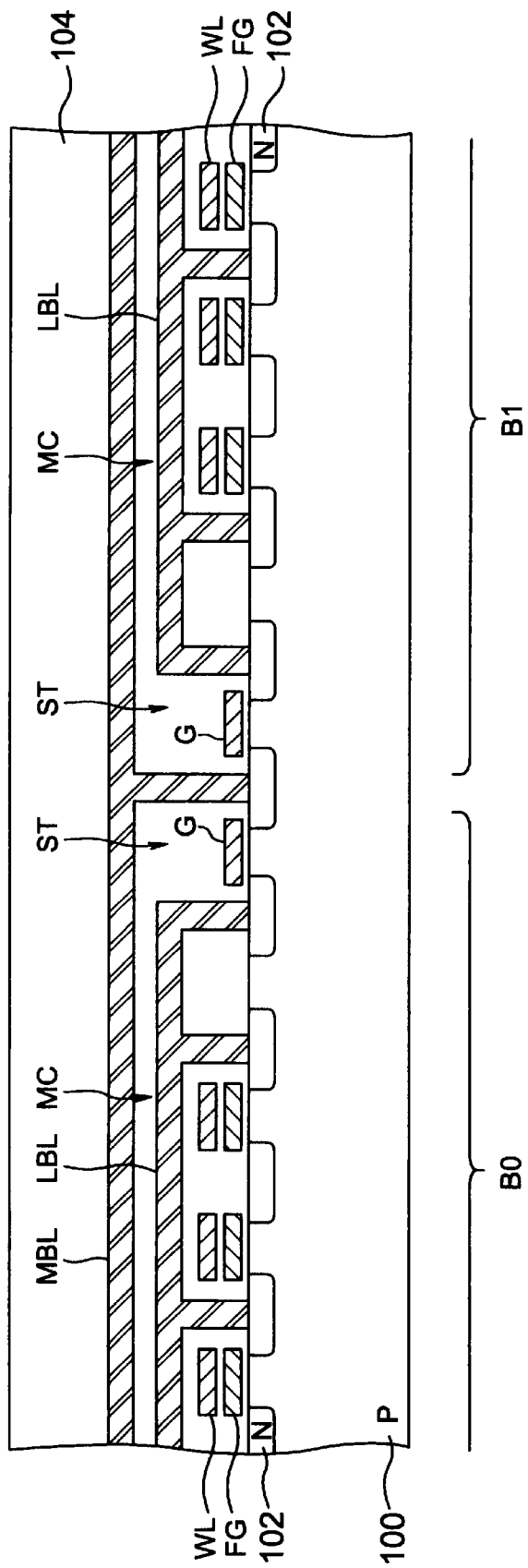
FIG. 3A is a sectional view of a block boundary portion of the memory cell array of FIG. 3.

FIG. 3A partially shows a cross section of the memory array 1 taken along a certain bit line of FIG. 3. As shown in FIG. 3A, a plurality of source/drain regions 102 are formed on the surface portion of a p-type semiconductor substrate 100. Between thee source/drain regions 102, the above described memory cell MC and select transistor ST are formed. The memory cell MC comprises a floating gate FG and a word line (a select gate) WL, which are formed between the source/drain regions 102. The select transistor ST comprises a gate electrode G formed between the source/drain regions 102. The gate electrode G and the word line WL are formed by etching the same polysilicon film.

One of the source/drain regions 102 of the select transistor ST is connected to the local bit line LBL, and the other is connected to the main bit line MBL. In this preferred embodiment, the local bit line LBL is formed of a first aluminium film, and the main bit line MBL is formed of a second aluminium film. In addition, an insulator film 104 is formed on the local bit line LBL and the main bit line MBL.

As will be described in detail later, in a mask process for the second aluminium film for patterning the main bit line MBL, the capacities of the divided banks BANK 1 and BANK 2 are determined.

Figure 4:
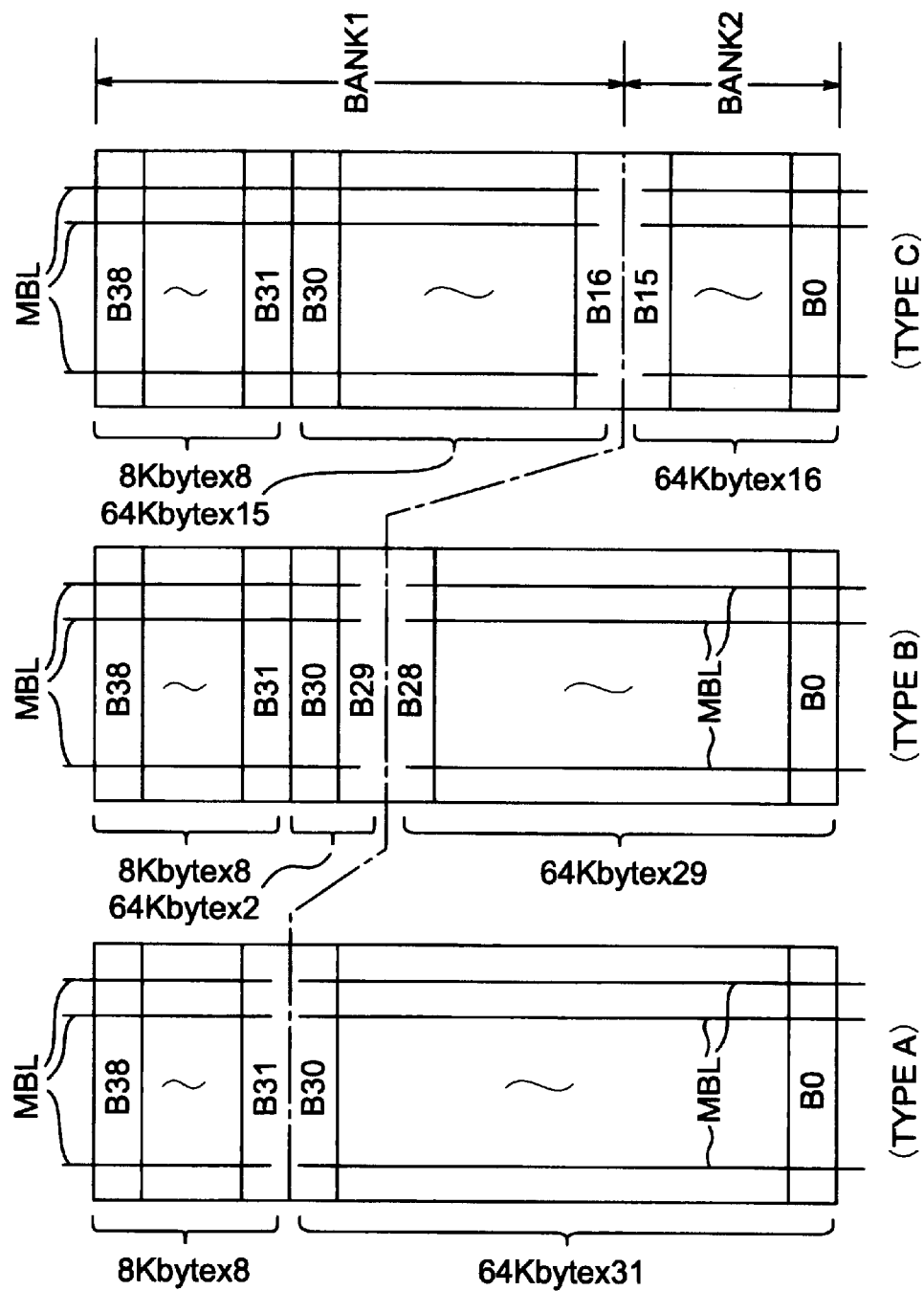
FIG. 4 is a schematic diagram showing an example of a division of a memory cell array into banks in the first preferred embodiment.

FIG. 4 show three types A through C of divisions of the memory cell array 1 into banks separating the main bit lines MBL in this preferred embodiment when the memory cell array 1 has 16 Mbits. For example, it is assumed that the memory cell array 1 comprises blocks B0 through B30, each of which has 64 Kbytes, and blocks B31 through B38, each of which has 8 Kbytes. In the type A, the memory cell array 1 is divided into a bank BANK 1 comprising blocks B31 through B38 having a capacity of 8 Kbytes×8, and a bank BANK 2 comprising blocks B0 through B30 having a capacity of 64 Kbyte×31. In this case, the main bit lines MBL are separated at the boundary between the blocks B31 and B30.

Figure 4A:
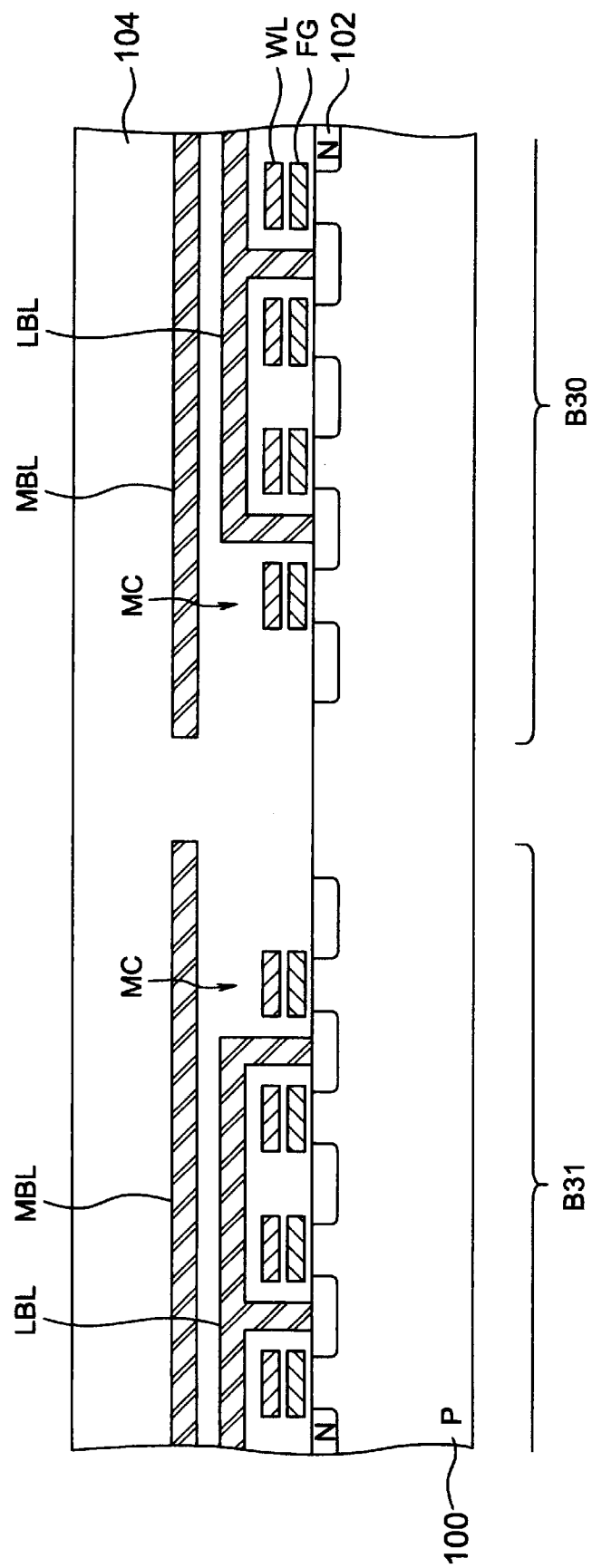
FIG. 4A is a sectional view of a separated portion of a main bit line in the memory cell array of FIG. 3.

FIG. 4A is a sectional view of the memory cell array 1 in the boundary portion between the blocks B31 and B30. As shown in FIG. 1, the main bit lines MBL are separated between the blocks B31 and B30 to be discontinuous.

Similarly, in the type B, the memory cell array 1 is divided into a bank BANK 1 comprising blocks B31 through B38 having a capacity of 8 Kbytes×8 and blocks B29 and B30 having a capacity of 64 Kbytes×2, and a bank BANK 2 comprising blocks B0 through B28 having a capacity of 64 Kbyte×29. In this case, the main bit lines MBL are separated at the boundary between the blocks B29 and B28. In the type C, the memory cell array 1 is divided into a bank BANK 1 comprising blocks B31 through B38 having a capacity of 8 Kbytes×8 and blocks B16 through B30 having a capacity of 64 Kbytes×15, and a bank BANK 2 comprising blocks B0 through B15 having a capacity of 64 Kbyte×16. In this case, the main bit lines MBL are separated at the boundary between the blocks B15 and B16.

Figure 5:
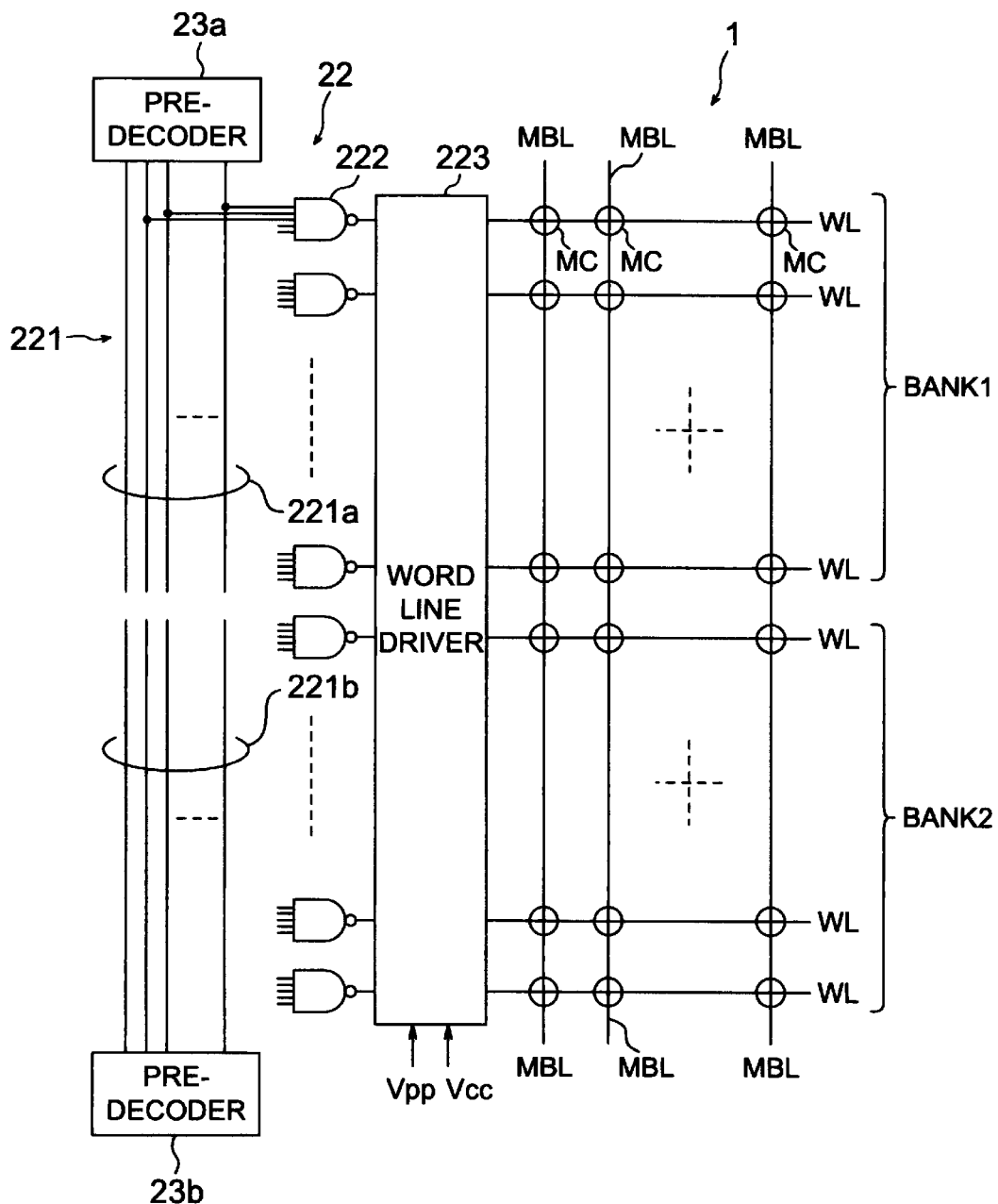
FIG. 5 is a diagram showing the details of a row decoder part in the first preferred embodiment.

FIG. 5 shows the details of the row decoder circuit 22 in this preferred embodiment. As shown in this figure, the row decoder 25 circuit 22 has address signal lines 221, NAND gates 222, each of which is provided for a corresponding one of the word lines WL for performing the coincidence detection of data of the address signal lines 221, and a word line driver 223 for driving the word lines in accordance with the output of each of the NAND gates 222.

As shown in this figure, the address signal lines 221 are separated at the same place as the separated place of the main bit lines MBL. The upper signal lines 221a are used for selection in the bank BANK 1, and the lower signal lines 221b are used for selection in the bank BANK 2. The required number of the signal lines 221a and 221b varies in accordance with the capacities of the banks BANK 1 and BANK 2. However, in this preferred embodiment, as the number of the signal lines 221a and 221b, the number required for selecting all of the word lines WL of the banks BANK 1 and BANK 2 is prepared. For example, when the banks BANK 1 and BANK 2 have 1024 ($2^{10}$) word lines WL in total, 10 address signal lines 221 are prepared. However, when inverted address signals are supplied from the pre-decoders 23a and 23b to each of the NAND gates 222, additional 10 inverted address signal lines are required. In addition, in this preferred embodiment, the address signal lines 221 are formed by etching the first layer AL film which is the same as the above described local bits line LBL.

In a mask process for the first aluminium film, the place for separating the address signal lines 221 is determined. Then, in the mask process for the second aluminium film which is the same as the above described main bit lines MBL, the connection relationship between the NAND gates 222 and the address signal lines 221 is determined.

Figure 6:
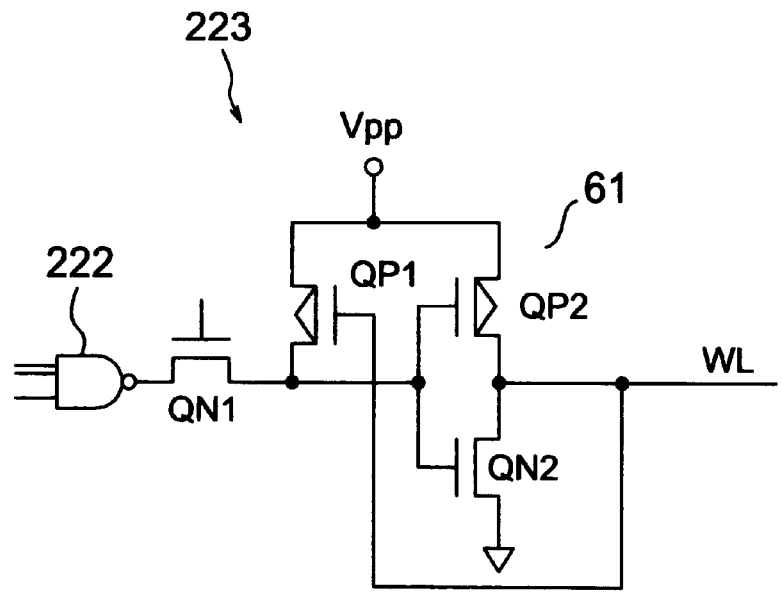
FIG. 6 is a circuit diagram showing the details of a word line driver part in the first preferred embodiment.

FIG. 6 shows a principal part of the word line driver 223 paying attention to one word line WL. The word line driver 223 includes a drive stage 61 which has an inverter structure comprising a PMOS transistor QP2 and an NMOS transistor QN2, a transferring NMOS transistor QN1 for transferring the output of the NAND gate 222 to the drive stage 61, and a feedback PMOS transistor QP1 for feeding the output of the drive stage 61 back to the input terminal thereof. To the sources of the PMOS transistors QP1 and QP2, the boosted voltage Vpp generated from a booster circuit (not shown) is applied during write.

The level of the output of the NAND gate 222 is "L" during select, and this is inputted to the drive stage 61 via the transferring NMOS transistor QN1. Thus, with respect to the selected word line WL, the PMOS transistor QP2 is turned ON, and the NMOS transistor QN2 is turned OFF. During write, the boosted voltage vpp is applied to the word line WL. The PMOS transistor QP1 serves to hold the drive stage 61 OFF when the level of the word line WL held at "L", and to accelerate the output transition of the drive stage 61 by the feedback of the potential of the word line WL. That is, when the word line WL rises, if it rises to a certain level, the PMOS transistor QP1 is turned OFF. When the word line WL falls, the PMOS transistor QP1 is turned ON at a certain level. Thus, the boosted voltage Vpp is applied to the input of the drive stage 61, so that the PMOS transistor QP2 is sufficiently turned OFF and the NMOS transistor QN2 is sufficiently turned ON.

As described above, according to this preferred embodiment, the division into the banks BANK 1 and BANK 2 is performed by separating the main bit lines MBL and the address signal lines 221 at the same place as the separated place of the main bit lines MBL. Therefore, the capacities of the banks BANK 1 and BANK 2 can be changed by only changing the mask process for the aluminium wiring.

Second Preferred Embodiment

Figure 8:
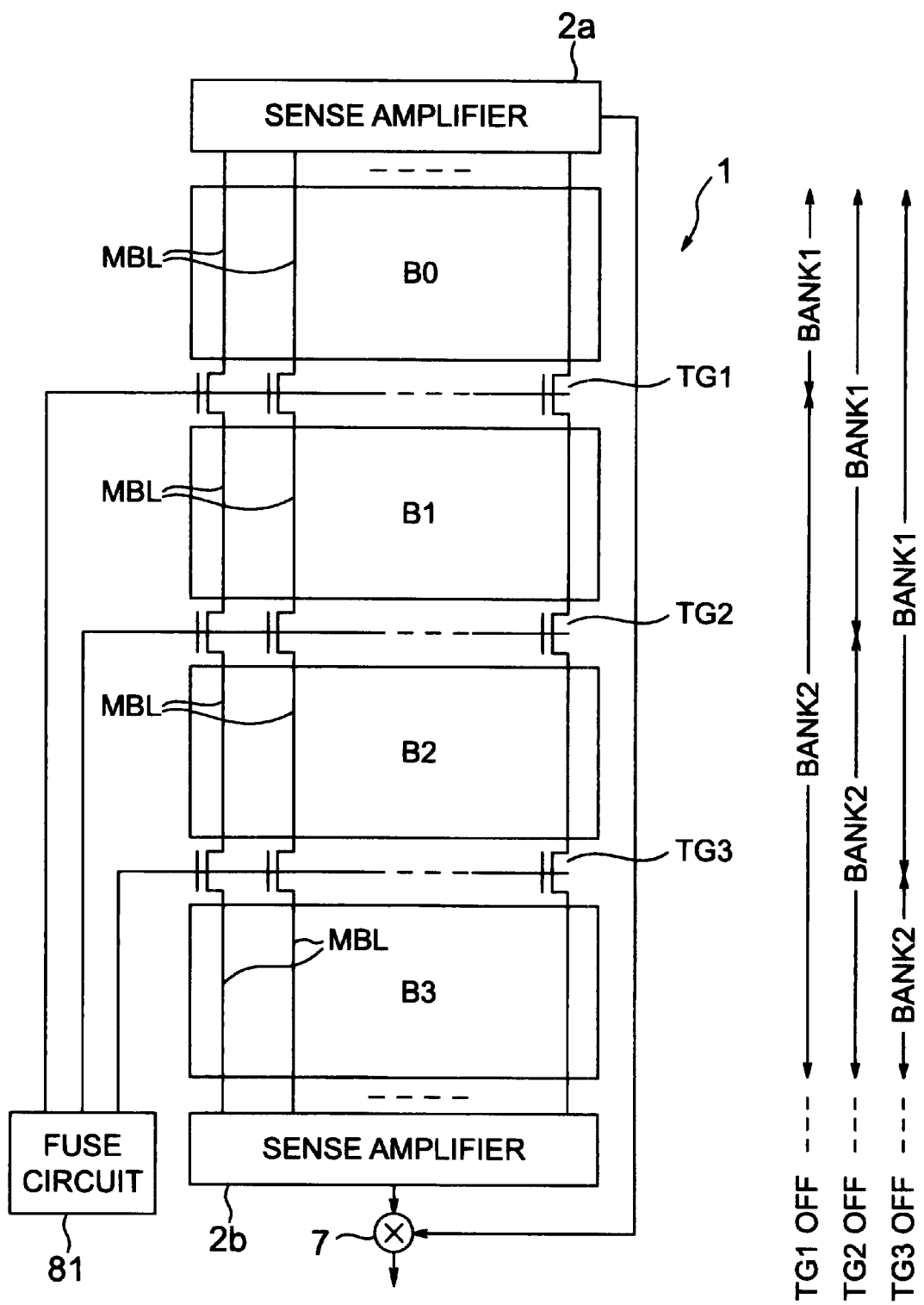
FIG. 8 is a schematic diagram showing a principal part of the second preferred embodiment of a flash memory according to the present invention.

FIG. 8 shows a principal part of the second preferred embodiment of an EEPROM according to the present invention. The basic architecture of a memory cell array 1 is the same as that in the above described first preferred embodiment. In this preferred embodiment, in order to divide the memory cell array 1 into two banks, at least two separating NMOS transistors TG for separating the bit lines are provided in each of the main bit lines MBL. Specifically, in the example shown in the figure, the memory cell array 1 comprises four blocks B0 through B3, and three separating NMOS transistors TG1 through TG3 for separating the main bit lines MBL at the boundary between adjacent blocks are provided in each of the main bit lines MBL.

In this preferred embodiment, for example, if the separating transistor TG1 is turned OFF and if the remaining separating transistors TG2 and TG3 are turned ON, the block B0 constitutes one bank BANK 1, and the remaining blocks B1 through B3 constitute the other bank BANK 2. In addition, if the separating transistor TG2 is turned OFF and if the remaining separating transistors TG1 and TG3 are turned ON, the blocks B0 and B1 constitute one bank BANK 1, and the remaining blocks B2 and B3 constitute the other bank BANK 2. Moreover, if the separating transistor TG3 is turned OFF and if the remaining separating transistors TG1 and TG2 are turned ON, the blocks B0 through B3 constitute one bank BANK 1, and the remaining block B3 constitutes the other bank BANK 2.

Figure 8A:
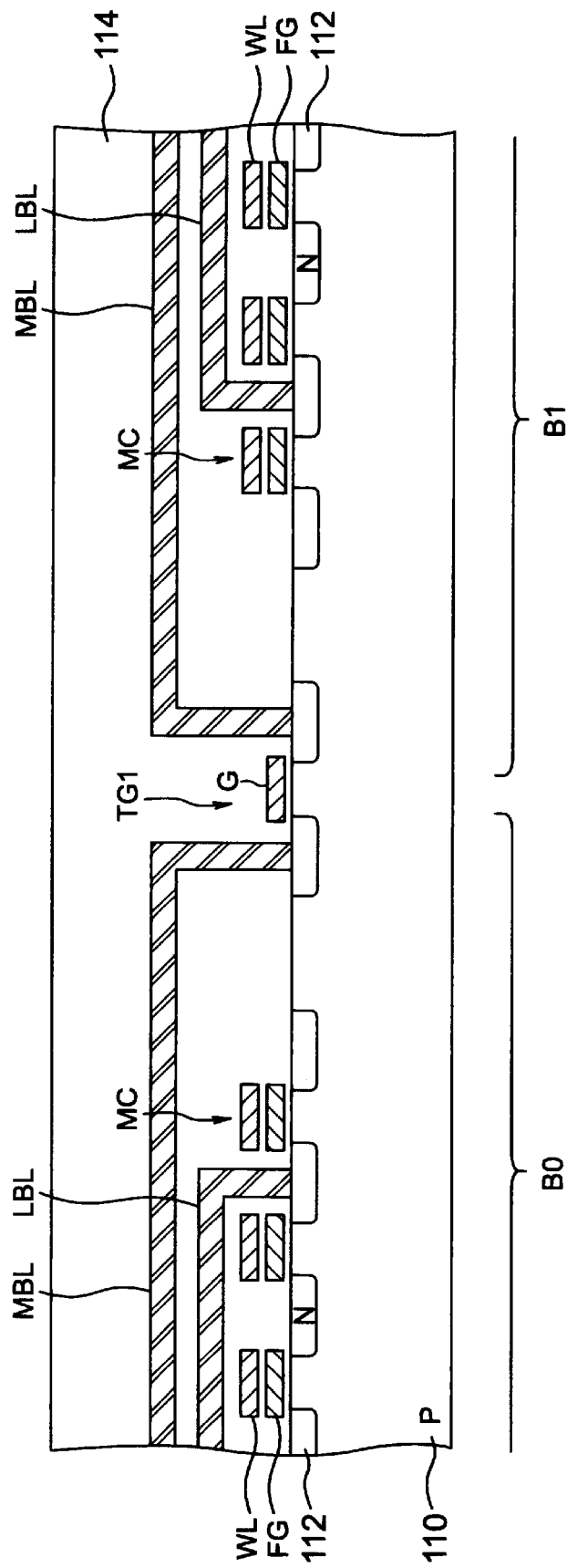
FIG. 8A is a sectional view of a separating transistor part in a memory cell array of FIG. 8.

FIG. 8A is a sectional view of the memory cell array of FIG. 8 taken along a bit line, which particularly shows a cross section between blocks B0 and B1. As shown in FIG. 8A, a plurality of source/drain regions 112 are formed on the surface portion of a p-type semiconductor substrate 110. Between these source/drain regions 112, the above described memory cell MC and separating NMOS transistor TG1 are formed. The memory cell MC comprises a floating gate FG and a word line WL, which are formed between the source/drain regions 112. In addition, the separating NMOS transistor TG1 comprises a gate electrode G formed between the source/drain regions 112. The gate electrode G and the word line WL are formed by etching the same polysilicon film.

The source/drain regions 112 of the separating NMOS transistor ST is connected to the main bit lines MBL. In this preferred embodiment, the local bit lines LBL are formed of a first aluminium film, and the main bit lines MBL are formed of a second aluminium film. In addition, an insulator film 114 is formed on the local bit lines LBL and the main bit lines MBL.

The ON-OFF control of the above described separating transistors TG1 through TG3 is performed by a fuse circuit 81 formed as a non-volatile memory circuit in the memory chip. Specifically, after all of processes for producing the memory chip are completed, the fuse circuit 81 is programmed, so that the capacities of two banks for the dual operation of the memory chip are fixedly set.

Figure 9:
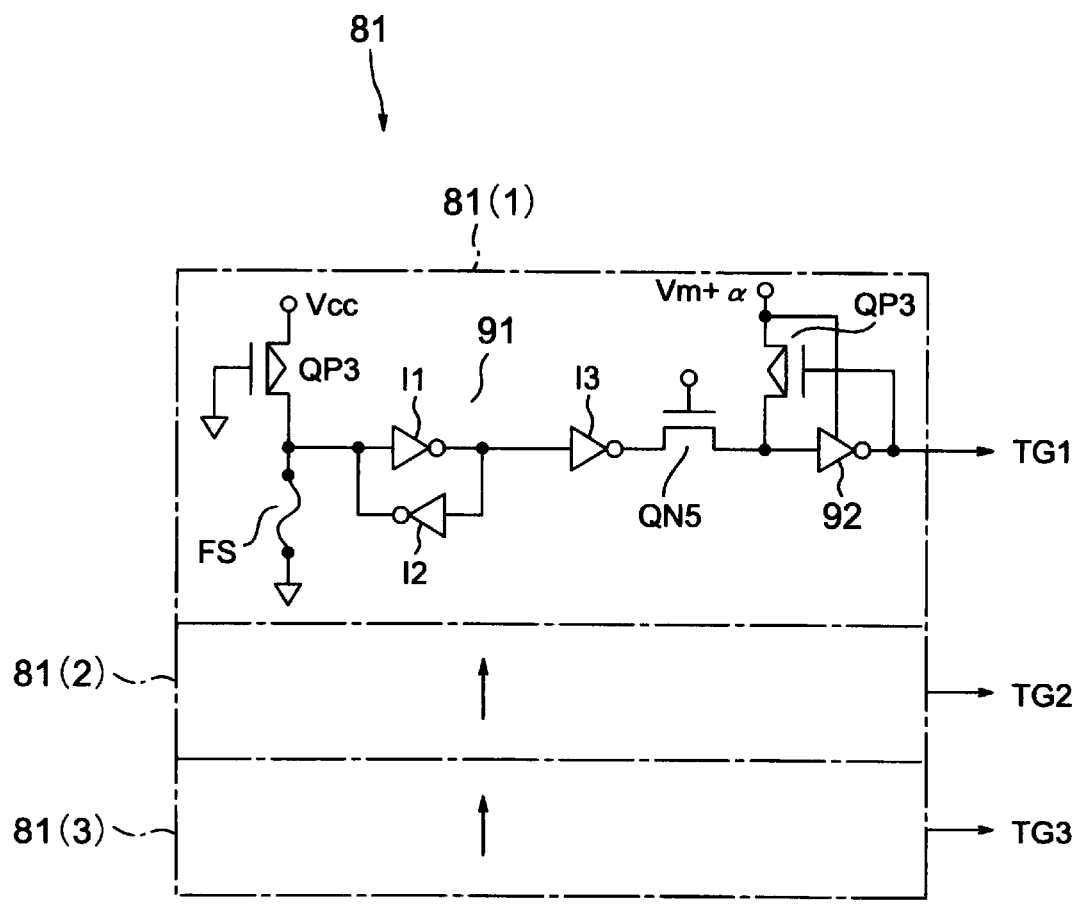
FIG. 9 is a circuit diagram of a fuse circuit in the second preferred embodiment.

FIG. 9 shows the architecture of the fuse circuit 81. The fuse circuit 81 has fuse circuit units 81(1) through 81(3) corresponding to the separating NMOS transistors TG1 through TG3. Each of the fuse circuit units 81(1) through 81(3) has a serially-connected circuit of a current source PMOS transistor QP3 and a fuse FS, and a latch circuit 91 of a cross connection of inverters I1 and I2 for holding the output of the serially-connected circuit. The output of the latch circuit 91 is supplied to the gate of the separating transistor TG via an inverter I3, a transfer gate transistor QN5 and a drive stage 92 having an inverter architecture. A voltage Vm+α necessary for transferring an intermediate voltage Vm (>Vcc), which is applied to the main bit lines MBL, by means of the separating transistor TG, which is turned ON, without causing voltage drop is applied to the drive stage 92 from a booster circuit (not shown) during write. The input terminal of the drive stage 92 is provided with a PMOS transistor QP3 which is turned ON for applying the voltage Vm+α to the input terminal when the level of the output terminal is "L".

That is, when the fuse FS is blown out, the latch circuit 91 holds the "L" output state by turning a power supply ON, so that a corresponding one of the separating transistors TG is turned OFF. Unless the fuse FS is blown out, the latch circuit 91 holds the "H" output state, so that a corresponding one of the separating transistors TG is turned ON.

Therefore, in this preferred embodiment unlike the preceding preferred embodiment, it is not required to change the mask during the formation of the main bit lines when the main bit lines MBL are separated in order to change the capacities of the banks. However, similar to the preceding preferred embodiment, it is required to change the wiring layout of the row decoder circuit part.

Third Preferred Embodiment

Figure 10:
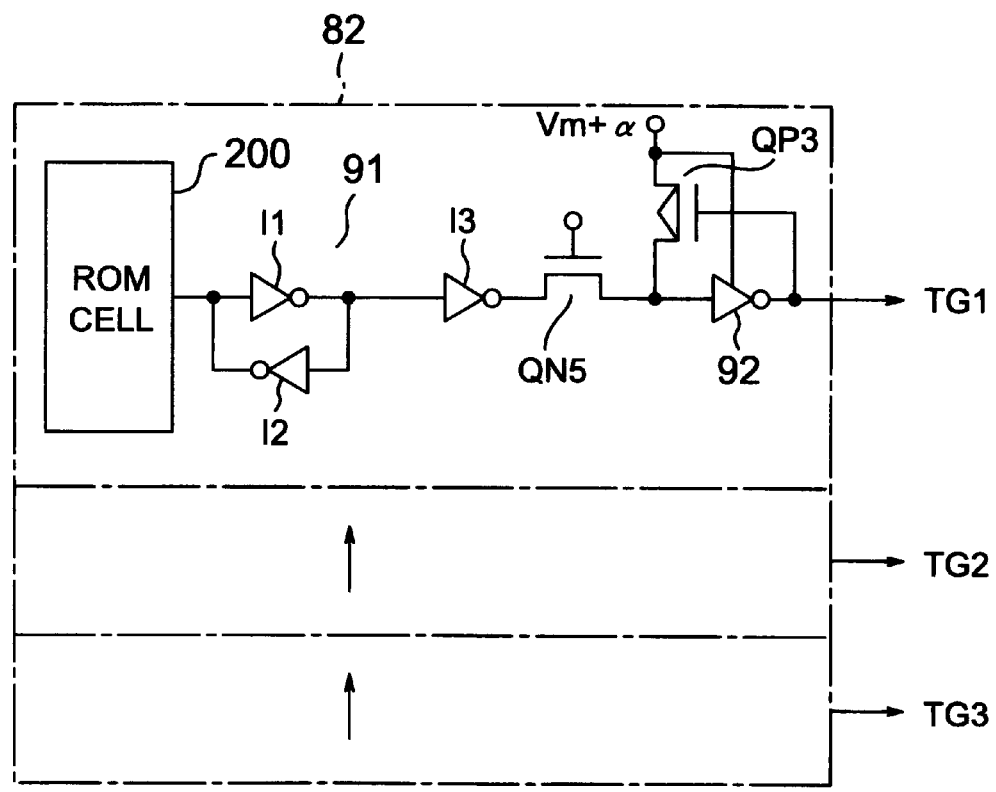
FIG. 10 is a circuit diagram of the third preferred embodiment of a setting storing circuit according to the present invention.

FIG. 10 shows a setting storing circuit 82 serving as the third preferred embodiment of a separation control circuit according to the present invention. In this preferred embodiment, the setting storing circuit 82 has a ROM CELL 200 in place of the current source PMOS transistor QP3 and the fuse FS of the fuse circuit 81 in the above described second preferred embodiment. The ROM CELL 200 is a state storing circuit which allows a user to optionally rewrite stored information to be high or low and which can hold information of high or low, which has been set once, even if the power supply is turned OFF.

Figures 11, 12:
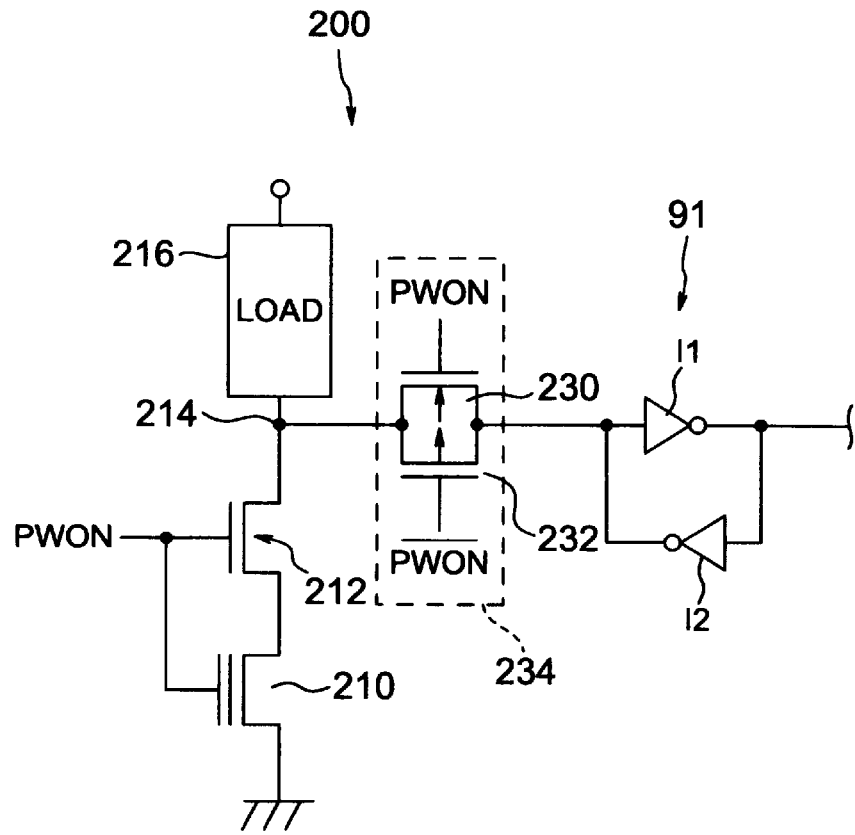
FIG. 11 is a circuit diagram showing a ROM CELL of FIG. 10.
FIG. 12 is a table showing the relationship between voltages applied to a non-volatile transistor of FIG. 11 during a data wiring/erasing operation.

FIG. 11 shows an example of an internal construction of the ROM CELL of FIG. 10. As shown in FIG. 11, the ROM CELL 200 has a non-volatile transistor 210 having the same construction as that of the above described memory cell MC. That is, the non-volatile transistor 210 comprises a floating gate and a control gate.

The source terminal of the non-volatile transistor 210 is connected to the ground potential. The drain terminal of the non-volatile transistor 210 is connected to a node 214 via an NMOS transistor 212. In addition, the gate terminals of the non-volatile transistor 210 and the NMOS transistor 212 are commonly connected, so that a control signal PWON, which holds a high level for a predetermined period of time when a power supply voltage is supplied to the whole memory chip, is supplied thereto. Since a circuit for generating the control signal PWON is known as a power-on clear signal generating circuit or the like, the detailed descriptions thereof are omitted.

In addition, a load element 216 comprising, e.g., a PMOS transistor or the like, is provided between the node 214 and a power supply terminal. Moreover, the node 214 is connected to the input terminal of a CMOS type transmission gate 234 comprising an NMOS transistor 230 and a PMOS transistor 232. A control signal PWON is supplied to the gate terminal of the NMOS transistor 230, and an inverted control signal /PWON, which is an inverted signal of the control signal PWON, is supplied to the gate terminal of the PMOS transistor 232. The output terminal of the transmission gate 234 is connected to the above described latch circuit 91.

FIG. 12 is a table showing the relationship between voltages when data are written in or erased or read from the non-volatile transistor 210. In FIG. 12, the voltage of the control gate is expressed by Vg, the voltage of the drain is expressed by Vd, and the voltage of the source is expressed by Vs.

Figure 13:
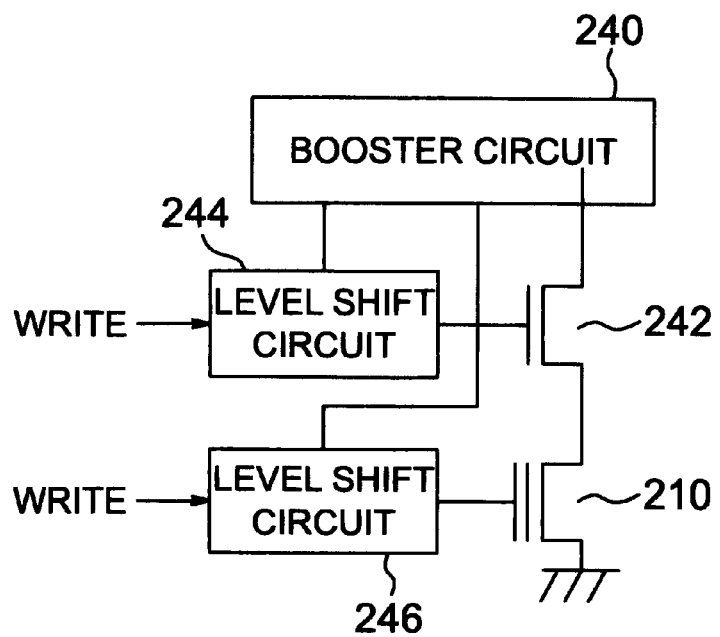
FIG. 13 is a conceptual diagram for explaining the operation when writing data in a non-volatile transistor.

FIG. 13 shows a write circuit for writing data in the non-volatile transistor 210. As shown in FIG. 13, the write circuit comprises a booster circuit 230, a select transistor 242, and level shift circuits 244 and 246.

The booster circuit 240 is a circuit for boosting a power supply voltage, which is supplied from the outside, to generate a plurality of boosted voltages higher than the power supply voltage. The select transistor 242 is a transistor for selecting the non-volatile transistor 210 provided in each of the separating NMOS transistors TG1 through TG3. That is, when the non-volatile transistor 242 is turned ON, one of the plurality of boosted voltages is supplied from the booster circuit 240 to the drain side of the non-volatile transistor 210.

In addition, other boosted voltages generated by the booster circuit 240 are also supplied to the level shift circuits 244 and 246. These level shift circuits 244 and 246 are circuits for shifting high-level write signals WRITE to voltage levels higher than the power supply voltage, respectively. The output of the level shift circuit 244 is supplied to the gate of the select transistor 242, and the output of the level shift circuit 246 is supplied to the control gate of the non-volatile transistor 210.

When data are written in the non-volatile transistor 210 by means of the write circuit, 10 V (Vg) is supplied from the level shift circuit 246 to the control gate of the non-volatile transistor 210, and 6 V (Vd) is supplied from the booster circuit 240 to the drain of the non-volatile transistor 210, as shown in FIG. 12. In addition, since the source of the non-volatile transistor 210 is grounded, the voltage thereof is 0 V (Vs).

Figure 14:
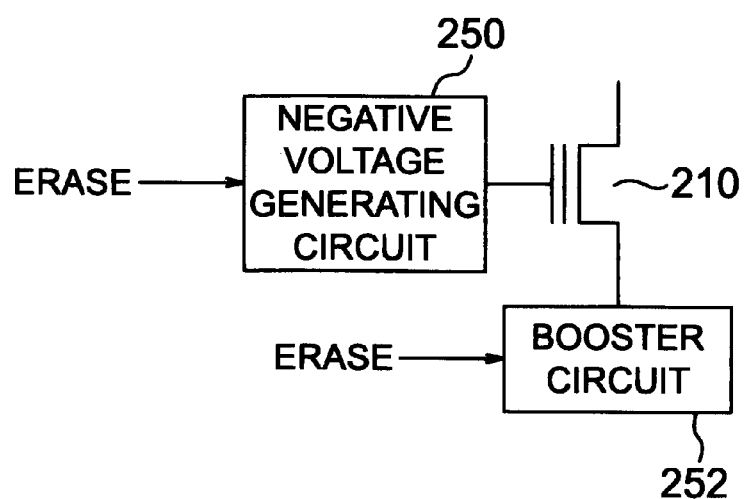
FIG. 14 is a conceptual diagram for explaining the operation when erasing data from a non-volatile transistor.

FIG. 14 shows an erase circuit for erasing data of the non-volatile transistor 210. As shown in FIG. 14, the erase circuit comprises a negative voltage generating circuit 250 and a booster circuit 252.

The negative voltage generating circuit 250 is a circuit for generating a negative voltage lower than the ground voltage of 0 V. The booster circuit 252 is a circuit for boosting the power supply voltage, which is supplied from the outside, to generate a boosted voltage higher than the power supply voltage.

When data are erased from the non-volatile transistor 210 by means of the erase circuit, erase signals ERASE are inputted to the negative voltage generating circuit 250 and the booster circuit 252. Then, as shown in FIG. 12, −7 V (Vg) is supplied from the negative voltage generating circuit 250 to the control gate of the non-volatile transistor 210, and 6 V (Vs) is supplied from the booster circuit 252 to the source of the non-volatile transistor 210. In addition, the drain of the non-volatile transistor 210 is in an open state.

As described above, according to the memory cell array in this preferred embodiment, the user can optionally perform the ON-OFF control of the separating transistor TG by means of the setting storing circuit 82, so that it is possible to optionally switch banks capable of writing and reading data in parallel. Therefore, the user can optionally select the capacity of a memory capable of writing and reading data in parallel.

The present invention should not be limited to the above described preferred embodiments, but the invention may be modified in various ways. For example, while the present invention has been applied to a NOR type EEPROM shown in FIG. 5 in the above described preferred embodiment, the invention may be applied to other types of EEPROMs, such as a NAND or AND type EEPROM.

Moreover, while the memory cell array has had the electrically rewritable non-volatile memory cell having the floating gate as a charge storage part in the above described preferred embodiment, the present invention should not be limited thereto. For example, a non-volatile memory cell having an MNOS structure may be used as an electrically rewritable non-volatile memory.

As described above, according to the present invention, it is possible to provide a semiconductor memory device of a dual operation type, which divides a memory cell array into banks by separating bit lines, and of a semi-custom system capable of easily changing of the capacities of the banks.

What is claimed is:

1. A semiconductor memory device comprising:
   a memory cell array having a plurality of memory cells, each of which is arranged at a corresponding one of intersections, at which bit lines intersect word lines, said memory cell array having at least two separation transistor groups including a plurality of separating transistors, each of which is provided in each of said bit lines said separating transistors in one of said separating transistor groups being turned OFF such that said memory cell array is divided into first and second banks;
   a first sense amplifier arranged on one side of said memory cell array in a bit line direction, said first sense amplifier being connected to said bit lines of said first bank to sense signals of said bit lines of said first bank;
   a second sense amplifier arranged on the other side of said memory cell array in said bit line direction, said second sense amplifier being connected to said bit lines of said second bank to sense signals of said bit lines of said second bank;
   a row decoder for selectively driving said word lines of said memory cell array; and a parallel control circuit for allowing one of said first and second banks to perform a data writing or erasing operation while allowing the other of said first and second banks to perform a data reading operation.

2. A semiconductor memory device as set forth in claim 1, which further comprises a separation control circuit which fixedly turns OFF said separating transistors in one of said separating transistor groups and which fixedly turns ON said separating transistors in the other separating transistor groups.

3. A semiconductor memory device as set forth in claim 2, wherein said separation control circuit comprises a plurality of fuses, each of which is provided so as to correspond to a corresponding one of said separating transistor groups, and wherein when one of fuses is blown out, said separating transistors of one of said separating transistor groups corresponding to said one of said fuses blown out is fixedly set to be turned OFF.

4. A semiconductor memory device as set forth in claim 2, wherein said separation control circuit comprises a plurality of separation control circuit unit, each of which is provided so as to correspond to a corresponding one of said separating transistor groups, each of said separation control circuit comprising:
a serially-connected circuit having a fuse provided between a first voltage terminal and a second voltage terminal;
a holding circuit for holding an output from a node between said first voltage terminal and said fuse, to output a holding signal; and
a drive circuit for generating a boosted signal by boosting a voltage of said holding signal to supply the boosted signal to separating transistors of the corresponding one of said separating transistor groups.

5. A semiconductor memory device as set forth in claim 2, wherein each of said memory cells of said memory cell array is an electrically rewritable non-volatile memory cell.

6. A semiconductor memory device as set forth in claim 2, wherein said separation control circuit comprises a plurality of state storing circuits, each of which is provided so as to correspond to a corresponding one of said separating transistor groups, each of said state storing circuits allowing a user to optionally rewrite stored information, and being capable of holding said stored information after a power supply is turned OFF, one of said state storing circuits being set at one state of a complementary data, and the remaining of said state storing circuits being set at the other state of the complementary data, so that said separating transistors of one of said separating transistor groups corresponding to said one of said state storing circuits having set at said one state is set to be turned OFF.

7. A semiconductor memory device as set forth in claim 2, wherein said separation control circuit comprises a plurality of separation control circuit unit, each of which is provided so as to correspond to a corresponding one of said separating transistor groups, each of said separation control circuit unit comprising:
a state storing circuit allowing a user to optionally rewrite stored information, and being capable of holding said stored information after a power supply is turned OFF;
a holding circuit for holding an output from said state storing circuit to output a holding signal; and
a drive circuit for generating a boosted signal by boosting a voltage of said holding signal to supply the boosted signal to said separating transistors of the corresponding one of said separating transistor groups.

8. A semiconductor memory device as set forth in claim 7, wherein said state storing circuit comprises:
a first transistor having an input terminal connected to a third voltage terminal, and a control terminal, to which a power-on control signal is inputted, said power-on control signal being at a high level for a predetermined period of time when a power supply voltage is applied to said semiconductor memory device;
a non-volatile transistor for holding said stored information, said non-volatile transistor having an input terminal connected to an output terminal of said first transistor, a control terminal, to which said power-on control signal is inputted, and an output terminal connected to a fourth voltage terminal; and
a transmission gate having an input terminal connected to said input terminal of said first transistor, and an output terminal for outputting said stored information to said holding circuit, said transmission gate establishing and blocking the electrical communication between said input terminal of said transmission gate and output terminal of said transmission gate.

9. A semiconductor memory device as set forth in claim 2, wherein each of said memory cells of said memory cell array is an electrically rewritable non-volatile memory cell.

10. A semiconductor memory device comprising:
a memory cell array having a plurality of memory cells, each of which is arranged at a corresponding one of intersections, at which bit lines intersect word lines, said memory cell array being divided into first and second banks along a line intersecting said bit lines, which are separated between said first and second banks;
a first sense amplifier arranged on one side of said memory cell array in a bit line direction, said first sense amplifier being connected to said bit lines of said first bank to sense signals of said bit lines of said first bank;
a first column gate circuit arranged between said first sense amplifier and said first bank;
a second sense amplifier arranged on the other side of said memory cell array in said bit line direction, said second sense amplifier being connected to said bit lines of said second bank to sense signals of said bit lines of said second bank;
a second column gate circuit arranged between said second sense amplifier and said second bank;
a row decoder for selectively driving said word lines of said memory cell array; and
a parallel control circuit for allowing one of said first and second banks to perform a data writing or erasing operation while allowing the other of said first and second banks to perform a data reading operation.

11. A semiconductor memory device as set forth in claim 10, wherein each of said first and second banks is divided into a plurality of blocks, and each of said bit lines is connected to a corresponding one of said memory cells via a local bit line provided independently in each of said blocks.

12. A semiconductor memory device as set forth in claim 11, wherein said bit lines is formed of upper wiring layer than said local bit lines.

13. A semiconductor memory device as set forth in claim 12, wherein source regions of said memory cells in each of said blocks are connected commonly to a common source line.

14. A semiconductor memory device as set forth in claim 13, wherein said bit lines are separated between said blocks.

15. A semiconductor memory device as set forth in claim 10, wherein said row decoder comprises:
a plurality of address signal lines separated between said first and second banks;
a plurality of coincidence detecting circuits, each of which is provided so as to correspond to a corresponding one of said word lines, each of said coincidence detecting circuits being connected to said address signal lines and outputting a coincidence signal when address signals are coincident with each other; and
a word line driver for supplying a predetermined voltage, in response to said coincidence signal, to one of said word lines corresponding to one of said coincidence detecting circuits, which has outputted said coincidence signal.

16. A semiconductor memory device as set forth in claim 10, wherein each of said memory cells of said memory cell array is an electrically rewritable non-volatile memory cell.

* * * * *